United States Patent
Grabinski

(10) Patent No.: US 11,275,879 B2
(45) Date of Patent: Mar. 15, 2022

(54) METHOD FOR DETECTING HAZARDOUS HIGH IMPEDANCE NETS

(71) Applicant: Dialog Semiconductor (UK) Limited, London (GB)

(72) Inventor: Jan Grabinski, Baden-Wuerttemberg (DE)

(73) Assignee: Diatog Semiconductor (UK) Limited, London (GB)

( * ) Notice: Subject to any disclaimer, the term of this patent is extended or adjusted under 35 U.S.C. 154(b) by 1126 days.

(21) Appl. No.: 15/649,058

(22) Filed: Jul. 13, 2017

(65) Prior Publication Data
US 2019/0018059 A1 Jan. 17, 2019

(51) Int. Cl.
G06F 30/3323 (2020.01)
G01R 31/28 (2006.01)
G06F 30/367 (2020.01)

(52) U.S. Cl.
CPC ..... *G06F 30/3323* (2020.01); *G01R 31/2834* (2013.01); *G06F 30/367* (2020.01)

(58) Field of Classification Search
CPC .............. G06F 30/3323; G06F 30/367; G01R 31/2834
See application file for complete search history.

(56) References Cited

U.S. PATENT DOCUMENTS

| | | | | |
|---|---|---|---|---|
| 5,144,173 A * | 9/1992 | Hui | ........................ | H03K 5/131 327/277 |
| 5,589,792 A * | 12/1996 | Brokaw | .................... | G05F 3/30 323/315 |
| 5,844,821 A * | 12/1998 | Roychowdhury | ...... | G06F 17/16 703/2 |
| 6,054,778 A * | 4/2000 | Downs | .................. | B60R 16/027 307/10.1 |
| 6,090,149 A * | 7/2000 | Nair | ...................... | G06F 30/367 703/14 |
| 6,175,946 B1 * | 1/2001 | Ly | .......................... | G06F 30/33 716/103 |

(Continued)

FOREIGN PATENT DOCUMENTS

| | | | | |
|---|---|---|---|---|
| JP | 2007213456 A | * | 8/2007 | |
| WO | WO-2005033984 A1 | * | 4/2005 | ........... G06F 30/367 |

OTHER PUBLICATIONS

Otte, Kim. "What is a Programmable Resistor?", Pickering Interfaces' Blog, Aug. 25, 2014, Accessed at https://blog.pickeringtest.com/what-is-a-programmable-resistor (Year: 2014).*

*Primary Examiner* — Iftekhar A Khan
(74) *Attorney, Agent, or Firm* — Saile Ackerman LLC; Stephen B. Ackerman

(57) ABSTRACT

A simulation method and a corresponding medium storing processor-executable code for detecting a high impedance net within an electronic circuit comprising a plurality of transistors is presented. The simulation method includes the step of connecting programmable resistors between two terminals of each transistor. Subsequently, voltage fluctuations are determined at the first terminals of a first group of transistors, where the voltage fluctuations are caused by connecting the programmable resistors. By connecting current sources with the first terminals of the first group of transistors, a potentially hazardous high impedance net may be detected within the electronic circuit.

22 Claims, 3 Drawing Sheets

(56) References Cited

U.S. PATENT DOCUMENTS

| | | | | |
|---|---|---|---|---|
| 6,259,389 B1* | 7/2001 | McGrath | G06F 30/367 | 341/120 |
| 6,370,492 B1* | 4/2002 | Akin | G06F 11/261 | 703/13 |
| 6,507,246 B1* | 1/2003 | Brokaw | H03F 3/3037 | 330/285 |
| 6,564,355 B1* | 5/2003 | Smith | G06F 30/367 | 716/115 |
| 7,013,252 B1* | 3/2006 | Shih | G06F 30/33 | 703/14 |
| 7,020,793 B1* | 3/2006 | Hsieh | H03L 7/0812 | 713/401 |
| 7,333,924 B1* | 2/2008 | Dastidar | G06F 30/367 | 703/2 |
| 7,587,305 B2* | 9/2009 | Lutz | G06F 30/33 | 703/15 |
| 8,255,191 B1* | 8/2012 | Kolpekwar | G06F 30/33 | 703/2 |
| 8,554,530 B1* | 10/2013 | O'Riordan | G06F 30/33 | 703/14 |
| 10,318,682 B1* | 6/2019 | Shen | G06F 30/3323 | |
| 10,705,984 B1* | 7/2020 | Fazeel | G06F 30/30 | |
| 10,878,149 B1* | 12/2020 | Newcomb | G06F 30/367 | |
| 2001/0034587 A1* | 10/2001 | Anderson | G06F 30/367 | 703/2 |
| 2002/0107647 A1* | 8/2002 | Anderson | G06F 30/367 | 702/65 |
| 2003/0067346 A1* | 4/2003 | Gaggl | G05F 3/262 | 327/540 |
| 2003/0083857 A1* | 5/2003 | Takahashi | G06F 30/367 | 703/18 |
| 2003/0169059 A1* | 9/2003 | Bodenstab | G06F 30/367 | 324/713 |
| 2005/0273298 A1* | 12/2005 | Shah | G06F 30/367 | 703/2 |
| 2009/0106720 A1* | 4/2009 | Nagata | G06F 30/3312 | 716/113 |
| 2011/0224965 A1* | 9/2011 | Hathaway | G06F 30/18 | 703/16 |
| 2012/0110528 A1* | 5/2012 | Newcomb | G06F 30/3323 | 716/106 |
| 2013/0275929 A1* | 10/2013 | Suzuki | G06F 30/327 | 716/104 |
| 2014/0028416 A1* | 1/2014 | Kimura | H03H 11/48 | 333/214 |
| 2016/0210394 A1* | 7/2016 | Lin | G06F 30/367 | |
| 2017/0052553 A1* | 2/2017 | Gebeyehu | H03F 3/19 | |
| 2018/0091231 A1* | 3/2018 | Rodriguez-Perez | H03G 3/3084 | |

\* cited by examiner

METHOD FOR DETECTING HAZARDOUS HIGH IMPEDANCE NETS

TECHNICAL FIELD

The present document relates to methods for detecting high impedance nets within an electronic circuit comprising a plurality of transistors. In particular, the present document relates to a computer-implemented method for detecting hazardous high impedance nets which may trigger unpredictable switching behavior of the transistors.

BACKGROUND

Hazardous high impedance nets are a common problem in microelectronics design processes. In general, a high impedance net (also known as hiZ or floating net) is regarded as an electrical connection connecting at least two adjacent circuit components (such as e.g. transistors or capacitors) within an electronic circuit, wherein said electrical connection is characterized by a relatively high electrical impedance. Thus, only a relatively small amount of current is flowing through said electrical connection. This small amount of current may be assumed to be close to zero and is e.g. a result of leakage currents within the adjacent circuit components. Due to the small amount of current flowing through the high impedance net, the electrical potential or voltage of the high impedance net is only loosely defined and may vary depending on various parameters and states of the electronic circuit. For instance, within a high impedance net located at the gate of a MOSFET transistor, the surrounding temperature may decide about the actual gate-source voltage at the transistor.

High impedance nets are not hazardous per se. However, under certain conditions, high impedance nets may trigger an unpredictable switching behavior of the transistors within the electronic circuit. This is in particular undesirable if low-power design technique are applied to reduce the power consumption of the electronic circuit. For example, a high impedance net located at the gate of a MOSFET transistor may accidentally enable a substantial current through the transistor, which may in turn lead to an accelerated depletion of a device's energy storage. Moreover, error propagation within the electronic circuit comprising a large numbers of circuit components (and in particular transistors) can make circuit verification a complex and time-consuming task.

Hazardous high impedance nets are often hard or impossible to be found using an analog simulator (e.g. Spectre, Spectra Accelerated Parallel Simulator APS). Also, it is hard to spot them manually by visual inspection. Often the reason for their existence is misconnection, connection by name, wrong library reference, or designer's mistake. Mistakes of the designer are common because usually during block level design, designers are not aware of all states in which the block will have to work (e.g. due to lack of one or more supplies). Typically, designers are supported with two checks: Synopsys connectivity check CCK and/or a dynamic check (Cadence, voltage based DC sweep). However, both checks are unreliable, generate false warnings/logs, and do not have high coverage.

SUMMARY

The present document addresses the above mentioned technical problems. In particular, the present document addresses the technical problem of providing a simulation method and tool for detecting hazardous high impedance networks with improved efficiency and accuracy. According to an aspect, a simulation method for detecting a high impedance net within an electronic circuit comprising a plurality of transistors is presented. The simulation method comprises connecting programmable resistors between two terminals of each transistor. Subsequently, voltage fluctuations are determined at first terminals of a first group of transistors, the voltage fluctuations caused by connecting said programmable resistors. By connecting current sources with the first terminals of the first group of transistors, a potentially hazardous high impedance net may be detected within the electronic circuit.

By identifying the first group of transistors as those transistors at which voltage fluctuations occur in response to connecting the programmable transistors, it becomes possible to identify, in a first step, high impedance nets which may be categorized as potentially hazardous, and to reduce the number of transistors which have to be tested, in a second step, by connecting the current sources to the identified transistors of the first group. In comparison to other high impedance net detection methods which directly connect current sources or voltages sources to terminals of all transistors, the proposed simulation method provides the advantage of a reduced computational complexity as current sources are only applied to the transistors located at high impedance nets. Moreover, connecting programmable resistors to the transistors is advantageous compared to solutions in which energy is injected into the electronic circuit (using e.g. said current sources or voltage sources) since the detection of false positives is avoided. If, for example, energy is injected into an unsupplied (i.e. powered off) part of the electronic circuit, a net with undefined electrical potential may be mistakenly identified as a high impedance net. As a further advantage, resistors create a more realistic scenario since resistors are modelling potential leakage between the terminals of the transistors.

The simulation method may be a computer-implemented method simulating the behavior of the electronic circuit over time. For example, the simulation method may be implemented as a software application on a computer comprising a central processing unit CPU and some form of volatile and/or non-volatile memory. In particular, the simulation method may be implemented as a stand-alone computer program for detecting hazardous high impedance nets in an electronic circuit. Alternatively, the simulation method may be integrated into an existing electronic design automation EDA software application for designing, simulating and verification of electronic circuits such as e.g. the Cadence® Spectre® circuit simulation platform.

In any case, the simulation method may start with the generation or retrieval of information characterizing the electronic circuit. For example, the simulation method may use information stored in layout records. Layout records may include information regarding net locations, net geometries, device locations, pin locations, dielectric layer thicknesses, and the like. Additionally or alternatively, said information may include netlists specifying values of electrical components (e.g. transistors, capacitors, resistors, diodes, or inductors) within the electronic circuit and interconnections therebetween.

After generation or retrieval of information characterizing the electronic circuit, the simulation method is carried out by simulating the physical behavior of the electrical components. The physical behavior may include resistive, inductive and/or capacitive interactions between the various electrical components. On the one hand, the transistors may be simulated according to pre-determined transistors models characterizing the physical behavior of the transistors. On the other hand, the programmable resistors may be simulated according to pre-determined resistor models comprising e.g. time-varying resistance values as will be discussed further below.

Preferably, the simulation method is not limited to a direct current DC analysis of the steady state of the electronic circuit. Rather, the simulation method may comprise a transient simulation of the electronic circuit, taking into account the dynamics of the voltages and/or currents at the different network nodes over time. At this, the simulation method may comprise displaying a graphical user interface for illustrating voltages and/or currents at the different network nodes over time. The output of the simulation method may comprise one or more hazardous high impedance nets which are detected during the simulation of the electronic circuit. Based on this output, the design of the electronic circuit may be adapted to increase reliability of the final product which may be manufactured based on the results of the disclosed method.

The transistors may be of any type such as e.g. bipolar junction transistors BJT or field-effect transistors FET. In case of field-effect transistors, the first terminals of the first group of transistors may be the gate terminals of the first group of transistors. In other words, the voltage fluctuations may be determined at the gate terminals of the transistors and the currents of the current sources may be injected into or drawn from the gate terminals of the transistors. In case of bipolar junction transistors, the first terminals of the first group of transistors may be the bases of the first group of transistors.

As already mentioned in the above description, the programmable resistors may model excessive leakage within the transistors. At this, a programmable resistor is regarded as a resistor whose resistance value is adjustable e.g. by the simulation tool. For example, the simulation method may include a step of varying resistance values of the programmable resistors over time. More specifically, the resistance values of the programmable resistors may be varied based on sinusoidal-shaped functions.

The programmable resistors may be connected between two terminals of each transistor such that, at each transistor, at least one programmable resistor is connected between two terminals of the transistor. At this, the set of programmable resistors may be subdivided into three sets. In particular, the step of connecting the programmable resistors may comprise connecting a first set of programmable resistors between the gate terminal and the source terminal of each transistor. Additionally, the step of connecting the programmable resistors may comprise connecting a second set of programmable resistors between the gate terminal and the drain terminal of each transistor. The resistance values of the first set of programmable resistors and the second set of programmable resistors may be very high, e.g. in the range of gigaohms. For example, said resistance values may be dynamically changed during transient simulation. The resistance values of the first set of programmable resistors may slowly change as a first sinusoidal function, and the resistance values of the second set of programmable resistors may slowly change as a second sinusoidal function. The second sinusoidal function may be a phase-shifted version of first sinusoidal function.

After connecting the first and second sets of programmable resistors, a third set of programmable resistors may be connected between the source terminal and the drain terminal of each transistor. The resistance values of the third set of programmable resistors may be high, but may be lower than the resistance values of the first set of programmable resistors and the second set of programmable resistors. For instance, the resistance values of the third set of programmable resistors may be at least one or two magnitudes smaller than the resistance values of the first set of programmable resistors or than the resistance values of the second set of programmable resistors. Again, the resistance values of the third set of programmable resistors may be dynamically changed during transient simulation. The resistance values of the third set of programmable resistors may slowly change as a third sinusoidal function, wherein the third sinusoidal function may be a phase-shifted version of the first sinusoidal function and/or a phase-shifted version of the second sinusoidal function.

The presence of the connected programmable resistors causes voltage fluctuations at the first terminals of the first group of transistors. Put in a different way, the simulation tool may identify a change of an electrical potential of a specific first terminal of a specific transistor with regard to a reference potential (e.g. ground) and add the specific transistor to the group of first transistors. The decision whether a voltage fluctuation is detected may e.g. depend on a pre-determined voltage threshold. In this case, the voltage fluctuation is only positively detected if the electrical potential deviates from the electrical potential before the addition of the programmable resistors by at least said pre-determined voltage threshold.

After the first set of programmable resistors and the second set of programmable resistors have been connected to the transistors and after the voltage fluctuations at the first terminals of the first group of transistors have been determined, said voltage fluctuations may be stopped by clamping the voltages at the first terminals to respective well-defined voltage values. For instance, said well-defined voltage values may be equal to the voltage values at the first terminals before the programmable resistors have been connected to the transistors.

Similarly, after the third set of programmable resistors has been connected to the transistors and after further voltage fluctuations at the first terminals of the first group of transistors have been determined, said further voltage fluctuations may be stopped by clamping the voltages at the first terminals to respective well-defined voltage values. Again, said well-defined voltage values may be equal to the voltage values at the first terminals before the programmable resistors have been connected to the transistors.

In conclusion, the determined first group of transistors may be transistors with floating gates, i.e. the gates of the first group of transistors may form part of a high impedance network which may be potentially hazardous. After the first group of transistors is identified, a first phase of the simulation method terminates.

At the beginning of a second phase of the simulation method, the third set of programmable resistors may be removed from the respective terminals of the transistors. Further, as already mentioned, the current sources are connected to the first terminals of the first group of transistors to inject current into or draw current from said first terminals. This may be done for all transistors in the group of first transistors only. The current sources may e.g. sink a small amount of current (e.g. in the range of nA) with randomly selected polarization. Optionally, the polarization of the current sources may be changed a few times.

Still in the second phase, the simulation method may further comprise the step of monitoring, in response to connecting said current sources, the gate-source voltages of the plurality of transistors. A second group of transistors at which the gate-source voltages cross a threshold voltage in response to connecting said current sources may be determined. In other words, in the second phase, it is checked whether the potentially hazardous high impedance nets found in the first phase are capable of switching a transistor. The high impedance nets found in the first phase may be harmful only if they are capable of switching further transistors or capable of sinking some current. This is why it may be checked if a random current injected into the first terminals of the transistors can switch on/off any further transistor.

At the beginning of a potential third phase of the simulation method, the third set of programmable resistors may be again connected to the respective terminals of the transistors. Alternatively, not all resistors within the third set of programmable resistors may be enabled again. Rather, the simulation method may comprise a step of connecting a fourth set of programmable resistors between the source terminal and the drain terminal of those transistors which do not belong to the second group of transistors. Subsequently, the simulation method may pause for a moment until all signals are settled.

The simulation method may further comprise opening the gates of the plurality of transistors. The opening of the gates may comprise determining the individual voltages at the gates, separating the gates from the respective transistors with infinite or very high impedances, and forcing the voltages at the gates to the determined individual voltages. As a consequence, the gates cannot be driven any longer from outside. However, the transistors may still be turned on and off by the simulation tool. In particular, the simulation method may further comprise (a) turning on transistors belonging to the second group of transistors, and, after some time, (b) turning off transistors belonging to the second group of transistors. Step (a) may be implemented by controlling the gate-source voltages of transistors belonging to the second group of transistors such that the latter transistors are turned on, and step (b) may be implemented by controlling the gate-source voltages of transistors belonging to the second group of transistors such that the latter transistors are turned off.

A third group of transistors may be determined at which voltage fluctuations occur at the gate terminals or at which the drain-source currents exceed a predetermined current limit. Specifically, only transistors which do not belong to the second group of transistors may be monitored for voltage fluctuation occurrence. All transistors may be monitored for drain-source current excess.

In the third phase of the simulation method, the identified transistors belonging to the third group of transistors are hazardous and require further consideration. It should be mentioned that, by opening the gates of all transistors, propagation is completely avoided. If, in the second phase, a transistor is found as an unpredictably switching transistor (i.e. belonging to the second group of transistors), it may be switched fully on and off. It may be switched dynamically during the transient simulation e.g. based on sinusoidal-shaped functions, but any other function may be applied as well. But before switching the transistor fully on and off, gates of all transistors may be opened. The gates of all devices may be opened because high impedance nets can trigger other gates, which will trigger further gates, so the high impedance net will propagate and it may be hard to trace it back. Once gates are opened, transistors belonging to the second group of transistors may be switched internally on and off. If any other gate is modulated by doing this, or excessive current is detected, then these transistors are identified as belonging to the third group of transistors. In this way, the latter transistors and the associated high impedance nets are marked as hazardous.

Before the programmable resistors are connected to the transistors, the electronic circuit may be driven to a state of interest. The state of interest may include at least one of a low power state, a power down state and a sleep state.

According to another aspect, a medium storing processor-executable code is presented. The code comprises code to detect a high impedance net within an electronic circuit comprising a plurality of transistors. More particularly, the code comprises code to connect programmable resistors between two terminals of each transistor, code to determine voltage fluctuations at first terminals of a first group of transistors, the voltage fluctuations caused by connecting said programmable resistors, and code to connect current sources with the first terminals of the first group of transistors.

The medium storing processor-executable code may be a computer-readable medium, and more particularly a non-transitory computer-readable storage medium.

The code may further comprise code to vary resistance values of the programmable resistors over time. In an exemplary implementation of the proposed simulation method, the resistance values of the programmable resistors may be varied based on a sinusoidal-shaped function.

Further, the code may further comprise code to stop, after the voltage fluctuations at the first terminals of the first group of transistors are determined, said voltage fluctuations by clamping the voltages at the first terminals to respective pre-determined voltage values.

All simulated transistors may be field-effect transistors and the first terminals of the first group of transistors may be the gate terminals of the first group of transistors. In this scenario, the medium may further comprise code to monitor, in response to connecting said current sources, the gate-source voltages of the plurality of transistors, and code to determine a second group of transistors at which the gate-source voltages cross a threshold voltage in response to connecting said current sources.

The medium may further comprise code to connect a fourth set of programmable resistors between the source terminal and the drain terminal of all transistors which do not belong to the second group of transistors. The code may further allow opening the gates of the plurality of transistors, wherein opening said gates requires code to determine the individual voltages at the gates, code to separate the gates from the respective transistors with infinite or very high impedances, and code to force the voltages at the gates to the determined individual voltages. The medium may further comprise code to control the gate-source voltages of transistors belonging to the second group of transistors such that the latter transistors are turned on, and code to control the gate-source voltages of transistors belonging to the second group of transistors such that the latter transistors are turned off. Finally, the medium may further comprise code to determine a third group of transistors at which voltage fluctuations occur at the gate terminals, or at which the drain-source currents exceed a predetermined current limit.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple", "connect", "coupled" or "connected" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Figure 1:
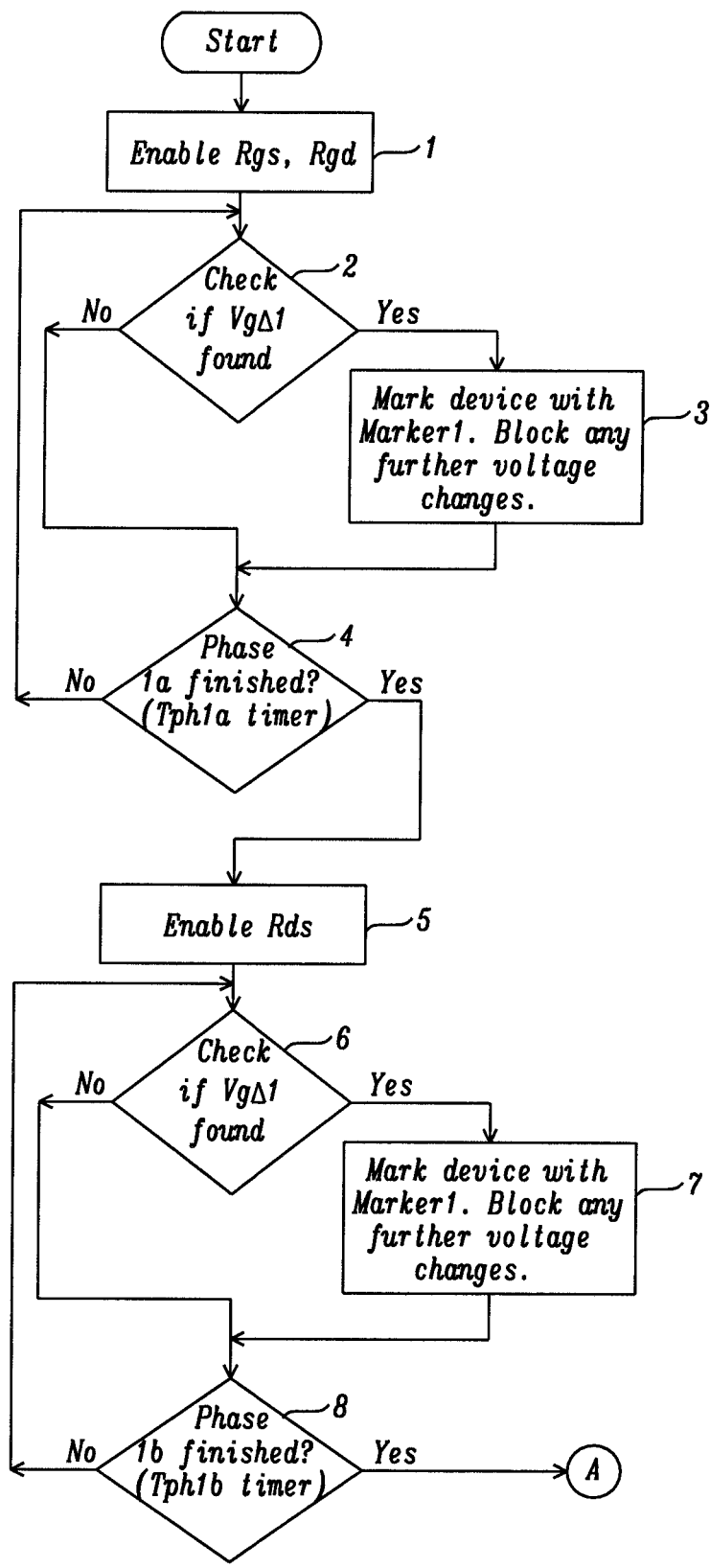
FIG. 1 shows a sequence diagram of first phase of a method for detecting high impedance networks.
Figure 2:
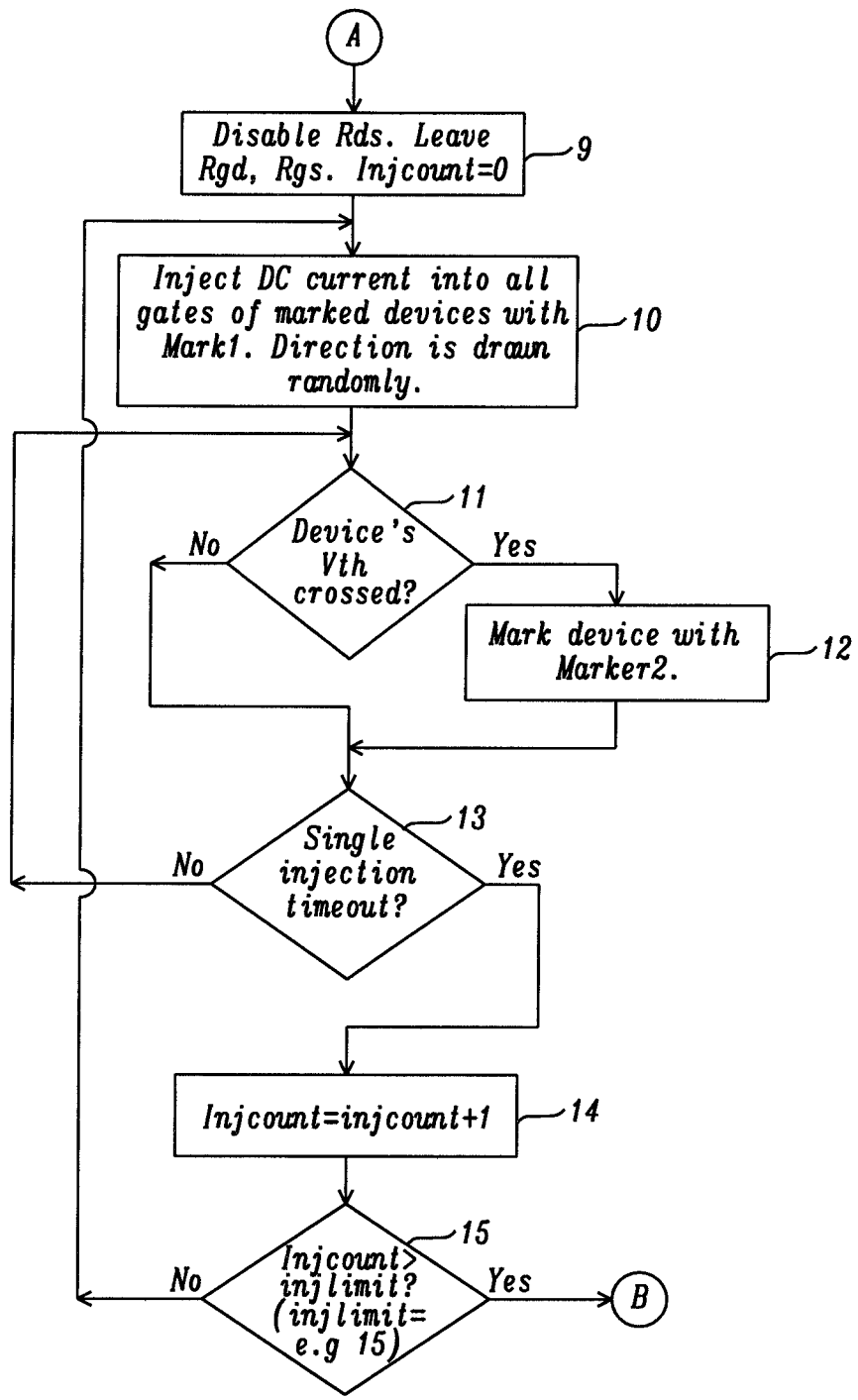
FIG. 2 shows a sequence diagram of second phase of a method for detecting high impedance networks.
Figure 3:
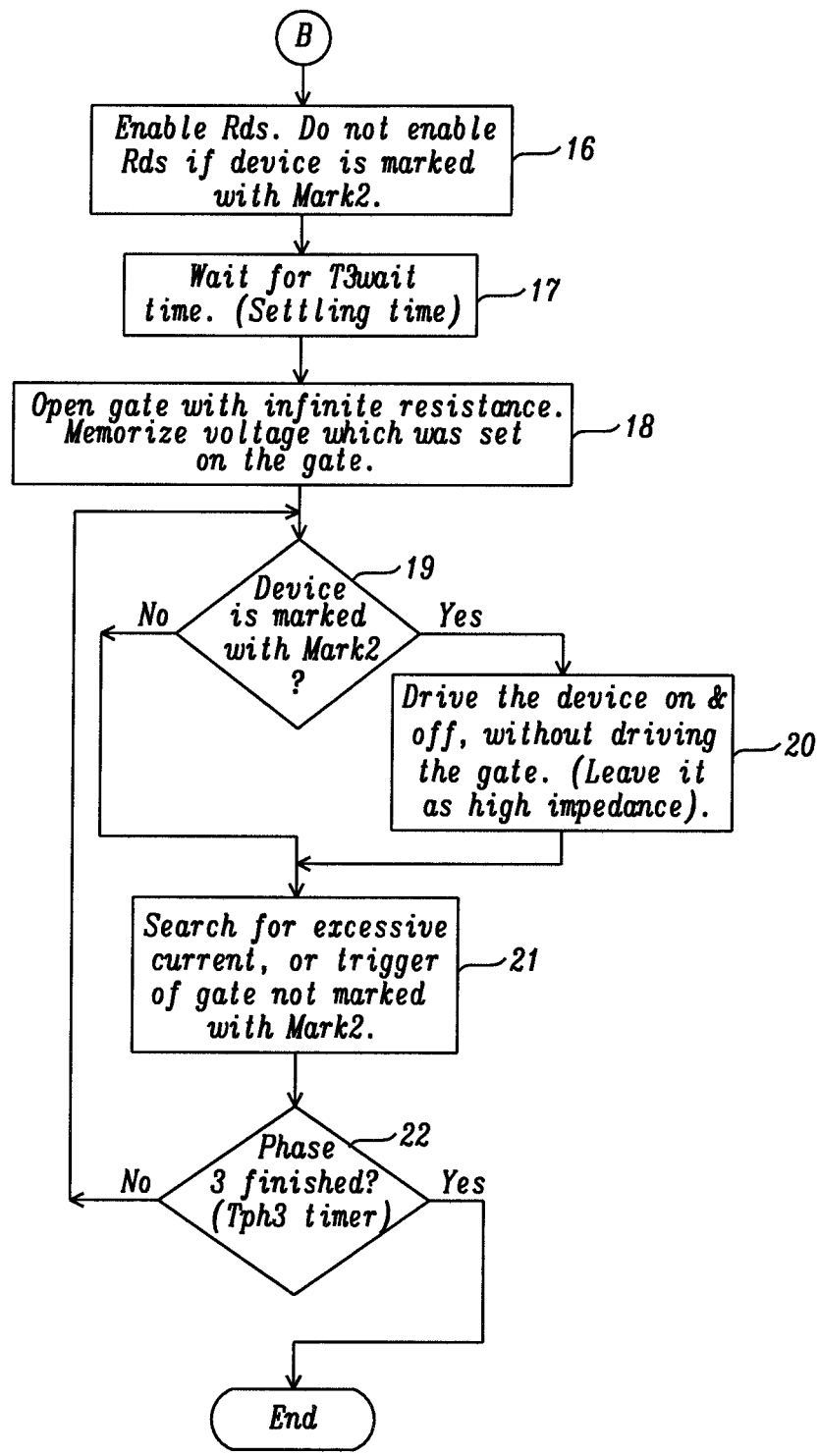
FIG. 3 shows a sequence diagram of third phase of a method for detecting high impedance networks.

As outlined above, the present document relates to a simulation method for detecting a high impedance net within an electronic circuit and a corresponding simulation tool. In the following description, an exemplary simulation method illustrated in FIGS. 1 to 3 is presented. However, the presented simulation method comprises a large number of optional steps and is not meant to limit the scope of the claims.

To search for hazardous floating nets, a designer has to setup a transient test bench in which the electronic circuit to be analyzed will go to the state of interest. Usually, states of interest for high impedance checks are low power states, a power down state, or a sleep state. Preferably, the state of interest may be a non-switching state, because in an operation state in which switching occurs, it may be impossible to distinguish if switching is caused by a high impedance net, or by natural operation of the electronic circuit. For example, in a ramp generation circuit, the current charging the capacitor flows in a high impedance net, which would be erroneously recognized as hazardous. The high impedance net check may be carried out in transient simulation and should be fast enough to run it as a top-level analog-mixed signal AMS simulation.

An exemplary first phase of the simulation method is depicted in FIG. 1 in form of a sequence diagram. The simulation method initializes three different markers (Marker1, Marker2, and Marker3) for each transistor within the electronic circuit to be analyzed. The markers are for example set to 0. After going to the state of interest, the simulation method starts in step 1 with enabling a first set of programmable resistors Rgs between the gate terminal and the source terminal of each transistor, and enabling a second set of programmable resistors Rgd between the gate terminal and the drain terminal of each transistor. By using programmable resistors Rgs and Rgd to modulate leakage currents of the transistors, a realistic scenario is created. The resistance values of the programmable resistors Rgs and Rgd may be adjusted to a constant value or may be changed dynamically during the transient simulation e.g. based on sinusoidal-shaped functions. In step 2, the voltages/electrical potentials at the gates of the transistors are checked to determine voltage fluctuations caused by enabling programmable resistors Rgs and Rgd in step 1. If a voltage fluctuation is detected at a particular gate, in step 3, the corresponding transistor is marked with Marker1 and the found voltage fluctuations are stopped e.g. by fixing the voltage at the terminal using a voltage source. An optional timer decides whether a first subphase 1a of the first phase is finished in step 4.

The simulation method continues in step 5 with enabling a third set of programmable resistors Rds between the drain terminal and the source terminal of each transistor. The resistance values of the programmable resistors Rds may be adjusted to a constant value or may be changed dynamically during the transient simulation e.g. based on a sinusoidal-shaped function. In step 6, the voltages/electrical potentials at the gates of the transistors are checked once more to determine further voltage fluctuations caused by enabling transistors Rds in step 5. If a voltage fluctuation is detected at a particular gate, in step 7, the corresponding transistor is marked with Marker1 and the found further voltage fluctuations are stopped e.g. by fixing the voltage at the terminal using a voltage source. An optional timer decides whether a second subphase 1b of the first phase is finished in step 8. After step 8, the first phase of the simulation method terminates.

In FIG. 2, the second phase of the exemplary simulation method begins with step 9 in which the third set of programmable resistors Rds is disabled again, whereas the first and the second set of programmable resistors Rgd and Rgs stay enabled. In addition, an optional counter Injcount is initialized with the value 0. In step 10, a DC current is injected into the gates of all transistors belonging to the first group of transistors, i.e. all transistors marked with Marker1. The DC current may be injected with the help of a current source/sink. Next, the gate-source voltages of all transistors are monitored in step 11. If the gate-source voltage of a transistor exceeds a pre-determined threshold voltage Vth or falls below the pre-determined threshold voltage Vth, said transistor is added to a second group of transistors. In step 12, the transistors of the second group are marked with Marker2. The second group of transistors represents transistors which are switchable by a high impedance net located at a gate of a transistor of the first group of transistors.

Steps 13 to 15 describe method steps which are specific to the chosen implementation of the algorithm. Those skilled in the art will appreciate that alternative forms of iterations may be applied to implement time constraints and/or to traverse all transistors among the plurality of transistors of the electronic circuit. In step 13, it is determined whether a timeout occurs when injecting the DC current at a single transistor. In step 14, the counter Injcount is incremented and in step 15, said counter is compared to an upper limit Injlimit. In the illustrated example, the upper limit Injlimit is chosen to equal 15.

In FIG. 3, the third phase of the exemplary simulation method begins with step 16 in which the third set of programmable resistors Rds is enabled only for transistors which do not belong to the second group of transistors, i.e. for those transistors not marked with Marker2. In step 17, the simulation pauses for a certain settling time until, in step 18, the voltages at the gates are determined and stored in memory, and all gates of all transistors are opened with infinite or very high resistances. In this way, propagation of signals is blocked. If, in step 19, it is determined that a transistor belongs to the second group, the transistors is turned on and off in step 20 without driving the gate of the transistor. If, in step 19, it is determined that a transistor does not belong to the second group, step 20 is omitted. In any case, in step 21, excessive currents or the triggering of gates of transistors not belonging to the second group is determined. At this, triggering of gates may happen when the gate-source voltage crosses the respective threshold voltage of the transistor. Hence, the gate-source to voltages of the transistors may be monitored in step 21. In other words, a hazardous high impedance net may be detected and marked with Marker3 (not shown) in case an excessive current or a signal propagation is detected. The latter condition means that one high impedance net may trigger further gates which were previously not connected to a high impedance net. In optional step 22, timer Tph3 is used to determine whether phase 3 is finished or whether the simulation method loops back to step 19.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A computer-based circuit simulation method for detecting a high impedance net within an electronic circuit comprising a plurality of transistors, the circuit simulation method comprising
    connecting, within a circuit simulation, programmable resistors between two terminals of each transistor,
    determining, within the circuit simulation, voltage fluctuations at first terminals of a first group of transistors, the voltage fluctuations caused by connecting said programmable resistors,
    connecting, within the circuit simulation, current sources with the first terminals of the first group of transistors,
    monitoring, within the circuit simulation, in response to connect current sources, the gate-source voltages of the plurality of transistors, and
    determining, within the circuit simulation, a second group of transistors at which the gate-source voltages cross a threshold voltage in response to connecting said current sources,
    wherein all transistors are field-effect transistors.

2. The circuit simulation method of claim 1, further comprising
    varying, within the circuit simulation, resistance values of the programmable resistors over time.

3. The circuit simulation method of claim 2, wherein the resistance values of the programmable resistors are varied during the circuit simulation based on a sinusoidal-shaped function.

4. The circuit simulation method of claim 1, further comprising
    after determining the voltage fluctuations at the first terminals of the first group of transistors, stopping, within the circuit simulation, said voltage fluctuations by clamping the voltages at the first terminals to respective pre-determined voltage values.

5. The circuit simulation method of claim 1, wherein connecting the programmable resistors comprises—connecting, within the circuit simulation, a first set of programmable resistors between the gate terminal and the source terminal of each transistor, and—connecting, within the circuit simulation, a second set of programmable resistors between the gate terminal and the drain terminal of each transistor.

6. The circuit simulation method of claim 5, wherein connecting the programmable resistors comprises
    after connecting the first and second set of programmable resistors, connecting, within the circuit simulation, a third set of programmable resistors between the source terminal and the drain terminal of each transistor.

7. The circuit simulation method of claim 6, wherein the resistance values of the third set of programmable resistors are at least one magnitude smaller than the resistance values of the first set of programmable resistors or than the resistance values of the second set of programmable resistors.

8. The circuit simulation method of claim 1, wherein the first terminals of the first group of transistors are the gate terminals of the first group of transistors.

9. The circuit simulation method of claim 1, further comprising
    connecting, within the circuit simulation, a fourth set of programmable resistors between the source terminal and the drain terminal of all transistors which do not belong to the second group of transistors.

10. The circuit simulation method of claim 9, further comprising opening, within the circuit simulation, the gates of the plurality of transistors, wherein the opening comprises
    determining, within the circuit simulation, the individual voltages at the gates,
    separating, within the circuit simulation, the gates from the respective transistors with infinite or very high impedances, and
    forcing, within the circuit simulation, the voltages at the gates to the determined individual voltages.

11. The circuit simulation method of claim 10, further comprising
    turning on, within the circuit simulation, transistors belonging to the second group of transistors, and
    turning off, within the circuit simulation, the transistors belonging to the second group of transistors.

12. The circuit simulation method of claim 11, further comprising determining, within the circuit simulation, a third group of transistors at which
    voltage fluctuations occur at the gate terminals,
    or at which the drain-source currents exceed a predetermined current limit.

13. The circuit simulation method of claim 1, further comprising
    before connecting said programmable resistors, driving, within the circuit simulation, the electronic circuit to a state of interest, wherein the state of interest includes at least one of a low power state, a power down state and a sleep state.

14. A non-transitory computer readable medium storing code, the code when executed by a processor performs a circuit simulation for detecting a high impedance net within an electronic circuit comprising a plurality of transistors, the code comprising:
    code to detect the high impedance net within the electronic circuit comprising the plurality of transistors,
    code to connect programmable resistors between two terminals of each transistor,
    code to determine voltage fluctuations at first terminals of a first group of transistors, the voltage fluctuations caused by connecting said programmable resistors,
    code to connect current sources with the first terminals of the first group of transistors,
    code to monitor, within the circuit simulation, in response to connecting said current sources, the gate-source voltages of the plurality of transistors, and code to determine, within the circuit simulation, a second group of transistors which the gate-source voltages cross a threshold voltage in response to connecting said current sources, wherein all transistors are field-effect transistors.

15. The medium according to claim 14, wherein the code further comprises code to vary resistance values of the programmable resistors over time.

16. The medium according to claim 15, wherein the resistance values of the programmable resistors are varied based on a sinusoidal-shaped function.

17. The medium according to claim 14, wherein the code further comprises code to stop, after the voltage fluctuations at the first terminals of the first group of transistors are determined, said voltage fluctuations by clamping the voltages at the first terminals to respective pre-determined voltage values.

18. The medium according to claim 14, wherein the first terminals of the first group of transistors are the gate terminals of the first group of transistors.

19. The medium according to claim 14, further comprising code to connect a fourth set of programmable resistors between the source terminal and the drain terminal of all transistors which do not belong to the second group of transistors.

20. The medium according to claim 19, further comprising code to open the gates of the plurality of transistors, wherein the code to open the gates comprises code to determine the individual voltages at the gates, code to separate the gates from the respective transistors with infinite or very high impedances, and code to force the voltages at the gates to the determined individual voltages.

21. The medium according to claim 20, further comprising code to turn on transistors belonging to the second group of transistors, and code to turn off transistors belonging to the second group of transistors.

22. The medium according to claim 21, further comprising code to determine a third group of transistors at which voltage fluctuations occur at the gate terminals, or at which the drain-source currents exceed a predetermined current limit.

\* \* \* \* \*